(12) United States Patent
Kaneshima et al.

(10) Patent No.: US 8,042,441 B2
(45) Date of Patent: Oct. 25, 2011

(54) METHOD FOR CUTTING PROTECTIVE TAPE OF SEMICONDUCTOR WAFER AND APPARATUS FOR CUTTING THE PROTECTIVE TAPE

(75) Inventors: Yasuji Kaneshima, Kameyama (JP); Takashi Nishinohama, Kameyama (JP); Masayuki Yamamoto, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 407 days.

(21) Appl. No.: 11/979,932

(22) Filed: Nov. 9, 2007

(65) Prior Publication Data
US 2008/0113492 A1    May 15, 2008

(30) Foreign Application Priority Data
Nov. 14, 2006    (JP) .................................. 2006-307726

(51) Int. Cl.
*B23Q 15/00* (2006.01)
(52) U.S. Cl. ................. 83/72; 83/76.1; 83/76.6; 83/582
(58) Field of Classification Search ............... 83/13, 872, 83/27, 490, 591–595, 582, 745, 72, 76, 76.1, 83/76.6–76.9, 26, 74, 483; 156/250, 353, 156/510, 267; 30/310
See application file for complete search history.

(56) References Cited

U.S. PATENT DOCUMENTS

| 4,603,609 | A | * | 8/1986 | Takatoshi ......................... 82/51 |
| 4,626,320 | A | * | 12/1986 | Alworth et al. ..................... 201/2 |
| 4,925,515 | A | * | 5/1990 | Yoshimura et al. ........... 156/250 |
| 6,258,198 | B1 | * | 7/2001 | Saito et al. ..................... 156/229 |
| 2005/0072517 | A1 | * | 4/2005 | Yamamoto ..................... 156/250 |
| 2006/0037694 | A1 | * | 2/2006 | Yamamoto et al. ........... 156/250 |

FOREIGN PATENT DOCUMENTS

| CN | 1738005 A | 2/2006 |
| JP | 2004-025402 A | 1/2004 |
| JP | 2005-159243 A | 6/2005 |

OTHER PUBLICATIONS

The First Office Action for the Application No. 200710187868.7 from The State Intellectual Property Office of the People's Republic of China dated May 17, 2010.

* cited by examiner

*Primary Examiner* — Phong H Nguyen
(74) *Attorney, Agent, or Firm* — Cheng Law Group, PLLC

(57) ABSTRACT

A cutter blade movably in a radial direction of a wafer is pressed for biasing to an outer circumferential edge of the semiconductor wafer. Simultaneously, the pushing biasing force of the cutter blade is controlled constant with automatic regulation corresponding to a traveling speed variation of the cutter blade, so that effect of a centrifugal force that works at the time of rotating travel of the cutter blade may not vary a pushing biasing force of the cutter blade. As a result, a contact pressure of the cutter blade to the outer circumferential edge of the semiconductor wafer is maintained stable.

2 Claims, 10 Drawing Sheets

METHOD FOR CUTTING PROTECTIVE TAPE OF SEMICONDUCTOR WAFER AND APPARATUS FOR CUTTING THE PROTECTIVE TAPE

BACKGROUND OF THE INVENTION (1) Field of the Invention

The present invention relates to a method for cutting a protective tape applied on the surface of a semiconductor wafer along with the contour of the wafer by traveling a cutter blade along with an outer circumferential edge of the semiconductor wafer, and relates to an apparatus for cutting the protective tape.

(2) Description of the Related Art

As methods for cutting protective tapes, there is known a method, wherein a protective tape is supplied and applied on the surface of a semiconductor wafer mounted and maintained on a chuck table; and subsequently the chuck table is rotated with a cutter blade stuck into the protective tape, that is, in the method the cutter blade is configured to travel relatively along with an outer circumferential edge of the wafer so as to cut the protective tape along with the contour the of the wafer (refer to JP-A 2004-25402).

As other methods for cutting protective tapes, there is known a method, wherein a protective tape is supplied and applied on the surface of a semiconductor wafer mounted and maintained on a chuck table; and subsequently a cutter blade is rotated and traveled along with an outer circumferential edge of the semiconductor wafer with a cutter blade stuck into the protective tape, that is, in the method the protective tape is configured to be cut along with the contour the of the wafer (refer to JP-A 2005-159243).

Since the former method using a rotating chuck table forces the chuck table having a large weight and a large inertia in a state of rest, and also having a large inertia in a moving state to be driven and rotated, the method needs a longer period of time for smooth rise of the speed from an idle state to a specified rotating speed. Smooth slowdown of the speed from a controlled rotating speed to the idle state similarly needs a longer period. Therefore, this means, as a whole, a tape cut treating cycle with a longer period of time.

In order to cope with such disadvantages, the method needs a motor for rotating and driving the chuck table having a larger force output, and exhibiting a larger starting torque, and simultaneously having a braking mechanism with a higher capability, etc., leading to consequent higher facility costs. Furthermore, the rotation of the large-sized chuck table having a larger weight with excellent accuracy and precision needs a supporting structure for rotation, and drive with higher accuracy and precision. As a result, these factors cause higher facility costs.

On the contrary, since the latter method of rotating and driving the cutter blade only rotates the lighter-weight structure compared with the chuck table, the method only needs a motor for rotative drive with a smaller force output, only needing a brake mechanism having smaller capability. Therefore, the method has an advantage of capability of implementation with a lower facility cost compared with the cost of the method of the table rotation type. However, in the method, the rotative travel of the cutter blade causes possible problems.

This kind of method of cutting the protective tape generally has following configurations of:

applying a pushing biasing force with a spring to the cutter blade;

forcing the edge of the blade of the cutter blade to be contacted to the outer circumferential edge of the semiconductor wafer with a moderate force; and traveling the cutter blade with suitable follow-up movement along with the outer circumferential edge of the wafer. However, the rotative travel of the cutter blade exerts a centrifugal force on the support component integrated with the cutter blade, and simultaneously the centrifugal force is also varied based on the variation of the traveling speed.

In a position of cutting start, and in a state of the cutter blade in contact by biasing force to the periphery of the wafer, the pushing biasing force for pressing with a spring serves, as it is, as a contact pressure of the cutter blade to the wafer periphery. That is, when the cutter blade in a halting state starts rotation, the centrifugal force increases as the traveling speed increases. As a result, the contact pressure of the cutter blade reduces in proportion to this centrifugal force. Conversely, the stable traveling speed of the cutter blade that has reached a specific speed stabilizes the centrifugal force, and also the contact pressure of the cutter blade. Furthermore, in an approximate end of cutting, the gradually reducing traveling speed of the cutter blade causes gradual reduction of the centrifugal force. Therefore, the contact pressure of the cutter blade increases, returning to the contact pressure at the time of cutting start. In this way, the contact pressure of the cutter blade to the outer circumferential edge of the semiconductor wafer varies based on the variation of the speed of the rotating travel of the cutter blade during one round of a periphery of the wafer, causing possible variation of cutting properties based on the position in a circumferential direction of the wafer. As a result, there may arise a problem of uneven finished state of the cut end of the tape in the circumferential direction.

SUMMARY OF THE INVENTION

The present invention has been accomplished taking such actual circumstances into consideration. That is, the present invention aims at providing a method for cutting a protective tape of a semiconductor wafer allowing cutting process of the tape having excellent accuracy and precision by a stable contact pressure of a cutter blade pushed against a periphery of a wafer, from the start to end of cutting process, in a process for cutting a protective tape by a rotating travel of a cutter blade, and also aims at providing an apparatus for cutting the protective tape.

The present invention provides a method for cutting a protective tape of a semiconductor wafer along with a contour of the semiconductor wafer by rotating and traveling a cutter blade along with an outer circumferential edge of the semiconductor wafer, the protective tape having been applied on the surface of a semiconductor wafer, the method comprising:

pushing the cutter blade, movably supported in a diameter direction of the semiconductor wafer, against the outer circumferential edge of the semiconductor wafer to bias inward; and automatically controlling the pushing biasing force corresponding to the variation of the traveling speed of the cutter blade, to allow stable maintenance for the contact pressure of the cutter blade to the outer circumferential edge of the semiconductor wafer.

According to the method for cutting the protective tape of the semiconductor wafer of the present invention, when the cutter blade is in a condition in contact with the outer circumferential edge of the wafer at a starting position of cutting, a predetermined contact pressure is applied on the cutter blade caused by a pushing biasing force. Start of the rotating travel of the cutter blade generates a centrifugal force applying to the cutter blade, and to a component for supporting the cutter blade, responding to the speed. Therefore, this centrifugal force reduces the contact pressure of the cutter blade to the outer circumferential edge based on the centrifugal force. Here, the variation of the contact pressure of cutter blade in a state with a blade halting and in a state with a centrifugal force generated is determined beforehand, and thus the compensation control of the pushing force of the cutter blade is performed, based on this variation. This compensation control enables the maintenance of a constant contact pressure of the cutter blade from the start to end of cutting process, therefore achieving uniform finish of the cut end of the tape all over the wafer peripheries. Furthermore, cutting of the protective tape having reliable agreement of the positions of the start and the end of cutting may be guaranteed.

When a mapped data or a computing equation are obtained beforehand, based on an actual measurement of the relationship between the magnitude of the centrifugal force and the traveling speed, a generated centrifugal force may be calculated based on the detection of the traveling speed. Furthermore, in the case where the characteristic of the variation of the speed for rotating the cutter blade is beforehand set up, the traveling amount and elapsed time of the cutter blade from the beginning of traveling may allow calculation of the traveling speed, and of the centrifugal force in each point of time.

There may be mentioned two methods, as methods of compensation control for the increase of a pressing force based on the amount of reduction of the pushing force in response to the centrifugal force.

In one of the methods, a pushing force may substantially be applied in such a manner that a pushing back force in a direction opposite to the direction of the pushing force is given beforehand in the condition where the cutter blade is pushed against and in contact to an outer circumferential edge of a wafer in the starting position of cutting, and the pushing back force is gradually reduced as the starting of the traveling of the cutter blade generates the centrifugal force.

In another method, an external force (pushing force) in a direction opposite to the centrifugal force is applied as the cutter blade starts traveling and generates a centrifugal force, allowing stable maintenance of a contact pressure of the cutter blade having a magnitude at the start point of time of cutting.

For example, the following possible configuration may be illustrated.

A constant pushing biasing force facing to an outer circumferential edge of a wafer is applied with respect to the cutter blade, and at the same time a pushing back force smaller than this pushing biasing force for control is applied from an opposite direction. And thereby the control based on the automatic adjustment may be achieved by making this pushing back force correspond to the variation of the traveling speed of the cutter blade.

In this method, in the condition where the cutter blade is pushed against and in contact to the outer circumferential edge of the wafer in the starting position of cutting, the cutter blade is pushed against the outer circumferential edge of the wafer with a contact pressure having a magnitude obtained by subtraction of a pushing back force for controlling from a constant pushing force. The constant pushing force and the pushing back force for controlling are determined so that the contact pressure at this time may give a desired magnitude for performing suitable tape cutting.

When the traveling of the cutter blade starts with generation of a centrifugal force, the cutter blade is pushed against the outer circumferential edge of the wafer with a contact pressure having a magnitude obtained by subtraction of a pushing back force for controlling and the centrifugal force from the constant pushing force. That is, the contact pressure increases by an amount of reduction that has decreased the pushing back force. Here, if the pushing back force is decreased by an amount equal to the generated centrifugal force, the substantial contact pressure of the cutter blade will be the same as the contact pressure at the starting point of time of traveling.

Specifically, following configurations may be mentioned.

A pushing biasing force is applied by means of a spring, and a pushing back force is applied by control of air pressure of an air cylinder.

The starting position of cutting of the cutter blade is determined by the pushing biasing force with the spring, and the pushing back force is applied by the control of the air pressure of the air cylinder, interlocking with the traveling of the cutter blade.

Furthermore, the time characteristics of a variation of the speed from a halting state where the cutter blade is in a starting position of cutting until a state where the cutter blade reaches a normal speed, and the time characteristics of a variation of the speed from the normal speed to halting state are beforehand determined;
the amount of traveling from a start point of time of traveling of the cutter blade is detected;
the speed variation is calculated based on the detection result; and
the air pressure of the air cylinder is controlled based on the information on the obtained variation.

Following configurations may also be mentioned as another configuration.

The control with the air pressure of an air cylinder determines a point of time where a cutter blade is stuck into a protective tape while applying a pushing biasing force applied by means of a spring, and also performs position control of the cutter blade to a starting position of cutting.

The fixed end of the spring is linked with an actuator, and thus the amount of operation of the actuator is controlled based on the traveling speed of the cutter blade detected by a sensor.

The present invention also uses following configurations in order to achieve the object of the present invention.

An apparatus for cutting a protective tape of a semiconductor wafer for cutting a protective tape applied on the surface of a semiconductor wafer along with the contour of the wafer by rotating travel of a cutter blade along with an outer circumferential edge of the semiconductor wafer, the apparatus comprising:
a pushing biasing device for applying a constant pushing biasing force facing to the outer circumferential edge of the semiconductor wafer with respect to the cutter blade movably supported in a radial direction of the wafer;
a pushing back device for applying a pushing back force smaller than the pushing biasing force in a direction opposite to the pushing bias direction with respect to the cutter blade; and
a controlling device for automatically controlling the pushing back force applied by the pushing back device corresponding to a variation of a traveling speed of the cutter blade.

This configuration enables suitable implementation of the method of the present invention.

Furthermore, the above-described method is preferably configured as follows.

The pushing biasing device is configured to apply a biasing force by pushing a cutter blade to an outer circumferential edge of a semiconductor wafer with an elastic restoring force of a spring;

the pushing back device is configured to apply a pushing back force in a direction opposite to the pushing bias direction with respect to the cutter blade; and the control device is configured to perform automatic control by making the air pressure supplied to an air cylinder correspond to the variation of the traveling speed of the cutter blade.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

Hereinafter, embodiments of the present invention will be described with reference to drawings.

Figure 1:
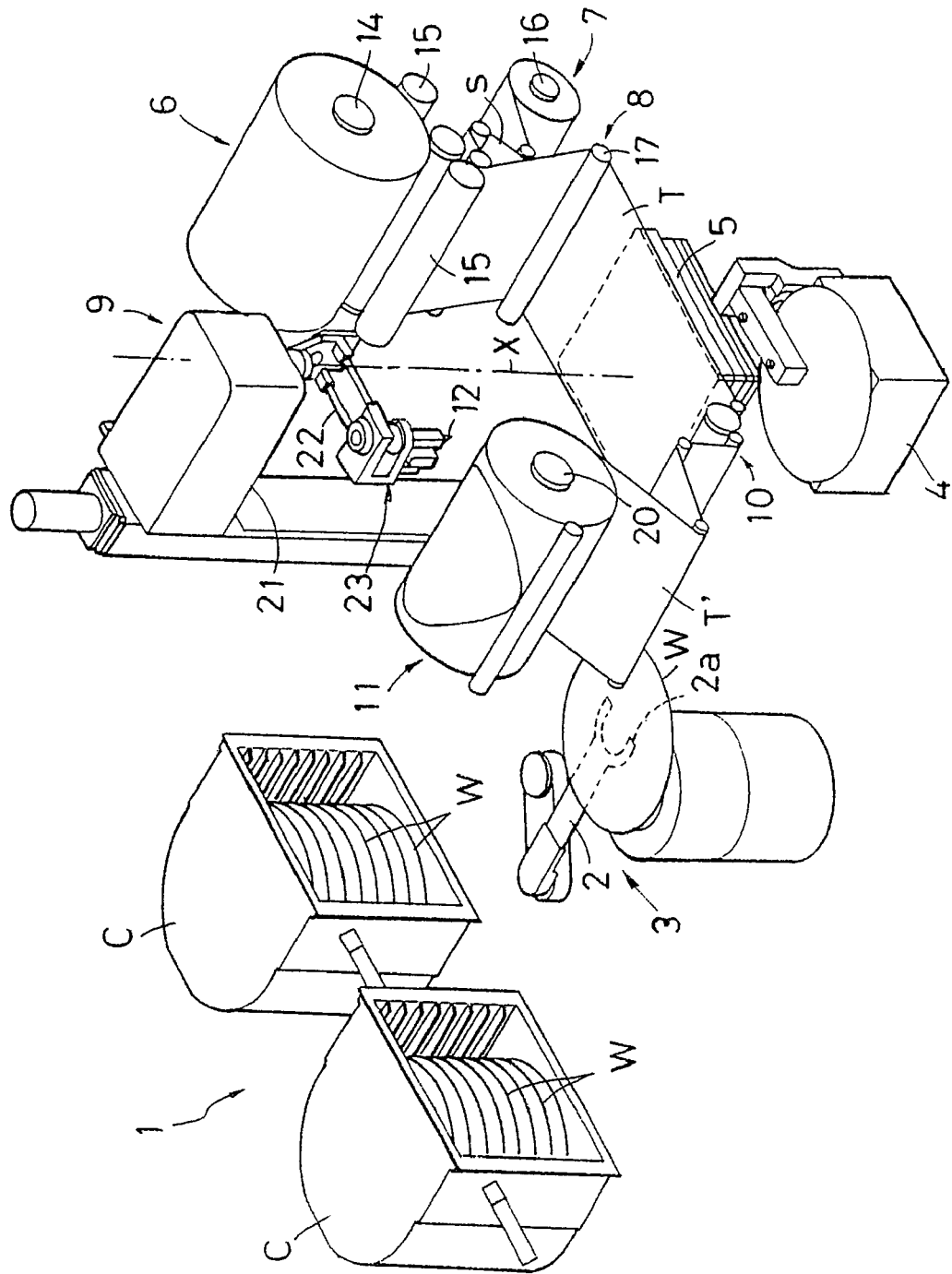
FIG. 1 is a perspective view illustrating a whole apparatus for applying a protective tape.

FIG. 1 is a perspective view illustrating a configuration of a whole apparatus for applying a protective tape.

As FIG. 1 illustrates, the apparatus for applying a protective tape comprises:

a wafer feeding/collecting section 1 for loading a cassette C that contains a semiconductor wafer W (hereinafter abbreviated as "wafer" for short); a wafer transport mechanism 3 provided with a robot arm 2; an alignment stage 4; a chuck table 5 for mounting and suction-holding the wafer W; a tape feed section 6 for feeding a protective tape T for surface protection to the wafer W; a separator collecting section 7 for separating and collecting a separator s from the protective tape T with the separator fed from the tape feed section 6; an application unit 8 for applying the protective tape T to the wafer W mounted and suction-held in the chuck table 5; an apparatus 9 for cutting the protective tape T applied on the wafer W, along with a contour thereof; a separating unit 10 for separating an unnecessary tape T' that has been applied and subsequently cut on the wafer W; and a tape collecting section 11 for rolling and collecting the unnecessary tape T' that has been separated with the separating unit 10 etc. Detailed configurations about each of the above-described structures and mechanisms will be described hereinafter.

The wafer feeding/collecting section 1 can include two sets of cassettes C in parallel. Each cassette C stores many wafers inserted thereinto in multi-stage, the wafers having circuit patterns side (surface) facing upward in a horizontal position. The robot arm 2 mounted in the wafer transport mechanism 3 is configured to be movable forward and backward in a horizontal direction, and simultaneously the whole robot arm is rotatably movable, and vertically movable. Furthermore, the end of the robot arm 2 has a horseshoe-shaped vacuum-suction type wafer holding section 2a. That is, the wafer holding section 2a is inserted into a gap between the wafers W stored in the cassette C in multi-stage, the wafer W is suction-held from the back side (underside). The suction-held wafer W is pulled out from the cassette C, and then transported in the order of the alignment stage 4, the chuck table 5, and the wafer feeding/collecting section 1.

The alignment stage 4 is designed so as to perform position control of the wafer W that has been carried in and mounted by the wafer transport mechanism 3, based on a notch and an orientation flat that have been formed in the periphery of the wafer.

Figure 6:
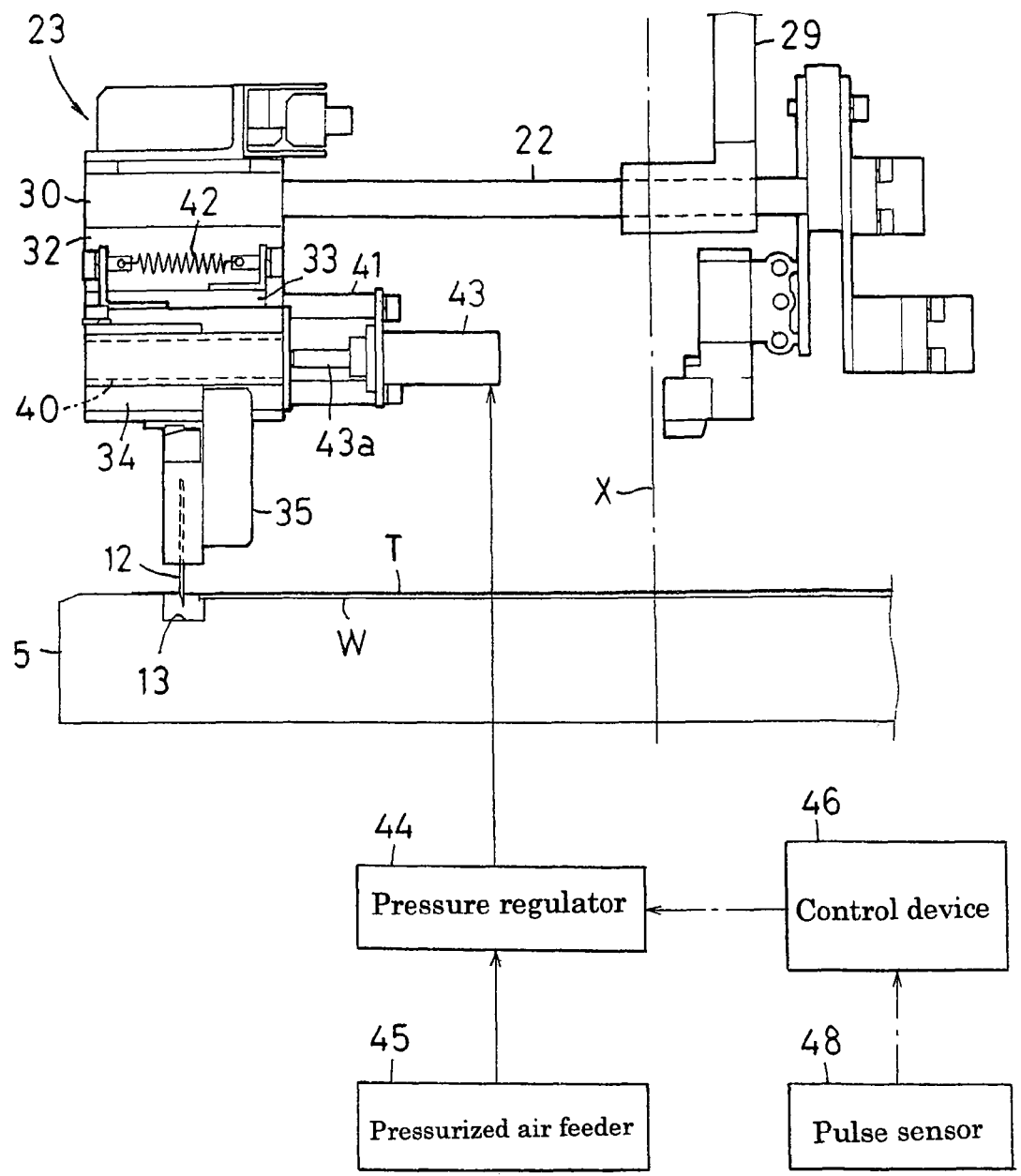
FIG. 6 is a side elevational view illustrating a principal part when a cutter blade is stuck into a protective tape.

The chuck table 5 is designed so as to suck with vacuum the wafer W that has been transported from the wafer transport mechanism 3 and mounted with an attitude in a predetermined position control. Furthermore, as FIG. 6 illustrates, a cutter traveling groove 13 is formed in the top face of this chuck table 5 in order to rotate and move the cutter blade 12 having the apparatus for cutting the protective tape 9, mentioned later, along with the contour of the wafer W and to cut the protective tape T.

The tape feed section 6, as illustrated in FIG. 1, is configured to guide the protective tape T having a separator delivered out from the delivering bobbin 14 by being wound around the guide roller 15 group so as to guide the protective tape T that has been separated from the separator s to the application unit 8. The delivering bobbin 14 is configured to avoid deliver of an excessive tape with moderate revolution resistance.

In the separator collecting section 7, the collecting bobbin 16 for taking up the separator s that has been separated from the protective tape T drives with rotation in a direction of the taking up.

The application unit 8 has an application roller 17 horizontally provided facing forward. Furthermore, the application unit 8 horizontally reciprocates right and left with a slide guiding mechanism 18 illustrated in FIG. 8 and with a drive mechanism in a screw feeding type (not illustrated).

The separating unit 10 has the separating roller 19 horizontally provided facing forward. That is, the separating unit 10 horizontally reciprocates right and left with the above-mentioned slide guiding mechanism 18 and with a drive mechanism in a screw feeding type (not illustrated).

In the tape collecting section 11, the collecting bobbin 20 for taking up the unnecessary tape T' drives with rotation in the direction of taking up.

Figure 2:
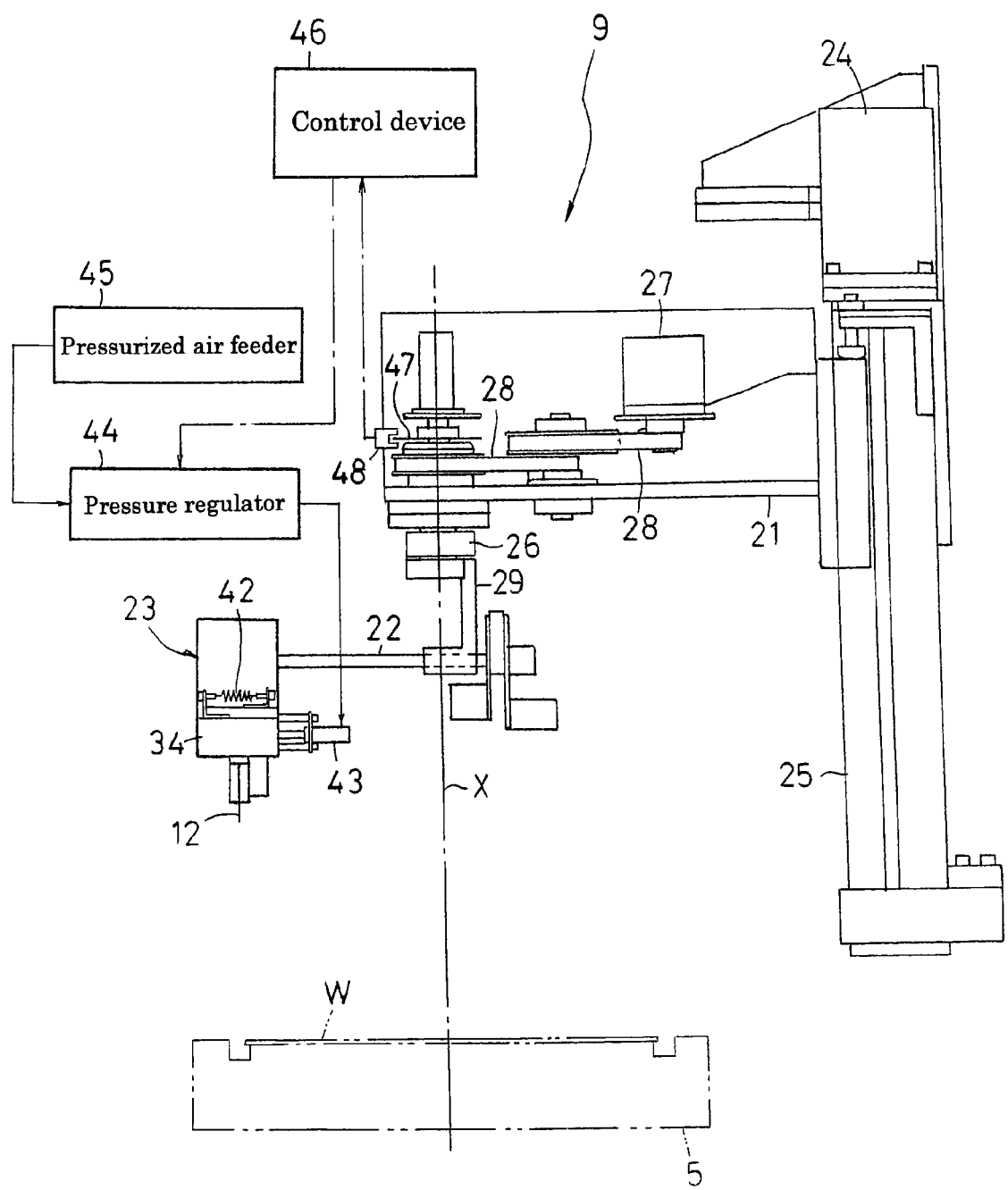
FIG. 2 is a side elevational view illustrating a whole apparatus for cutting a protective tape.

In the tape cutting mechanism 9, as illustrated in FIG. 2, a pair of support arms 22 is rotatably equipped in parallel around a vertical axis center X located on a center of the chuck table 5 in a lower part of a vertically movable base 21. The cutter unit 23 in the side of free end of this support arm 22 has a cutter blade 12 with an edge of the blade facing downward. That is, the rotation of the support arm 22 around the vertical axis center X as a center of rotation drives the cutter blade 12 with rotation along with the periphery of the wafer W to cut the protective tape T. FIGS. 2 to 6 illustrate the detailed configuration.

As illustrated in FIG. 2, the movable base 21 moves up and down along with a longitudinal rail 25 by forward and backward rotation of the motor 24 with screw thread feeding. A rotating shaft 26 rotatably equipped around the vertical axis center X is operatively connected to a motor 27 disposed on the movable base 21 for deceleration through two belts 28 in the free end part of this movable base 21. That is, the operation of the motor 27 rotates the rotating shaft 26 in a predetermined direction. And a support arm 22 is supported penetrating therethrough at a bottom end of the support component 29 extended downward from the rotating shaft 26 to enable horizontal slide adjustment. The slide adjustment of the support arm 22 allows variation control of a distance from the vertical axis center X in a center line of rotation of the cutter blade 12, that is, the rotating radius of the cutter blade 12 in correspondence with the diameter of the wafer.

Figure 3:
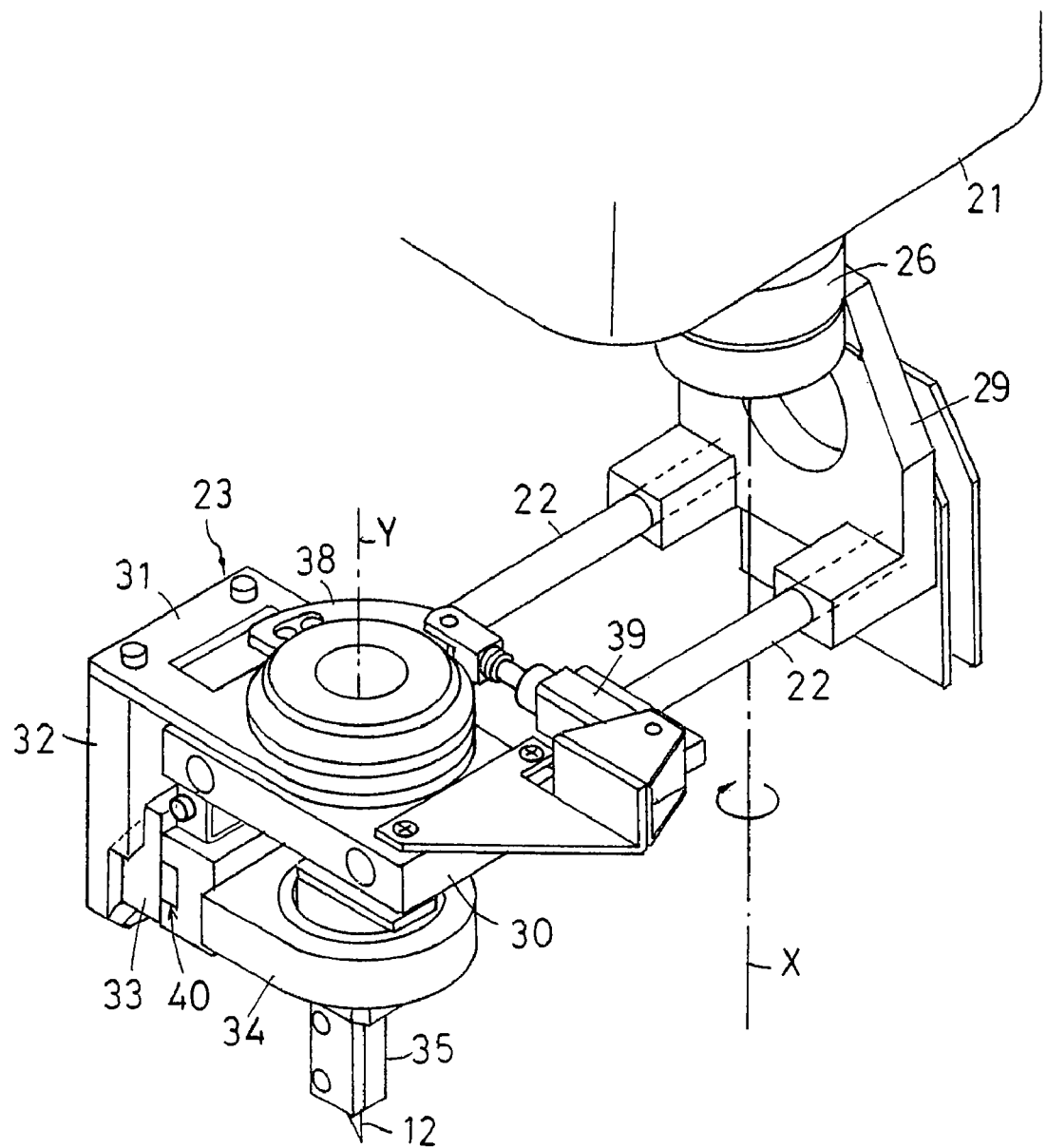
FIG. 3 is a perspective view illustrating a principal part of an apparatus for cutting a protective tape.
Figure 5:
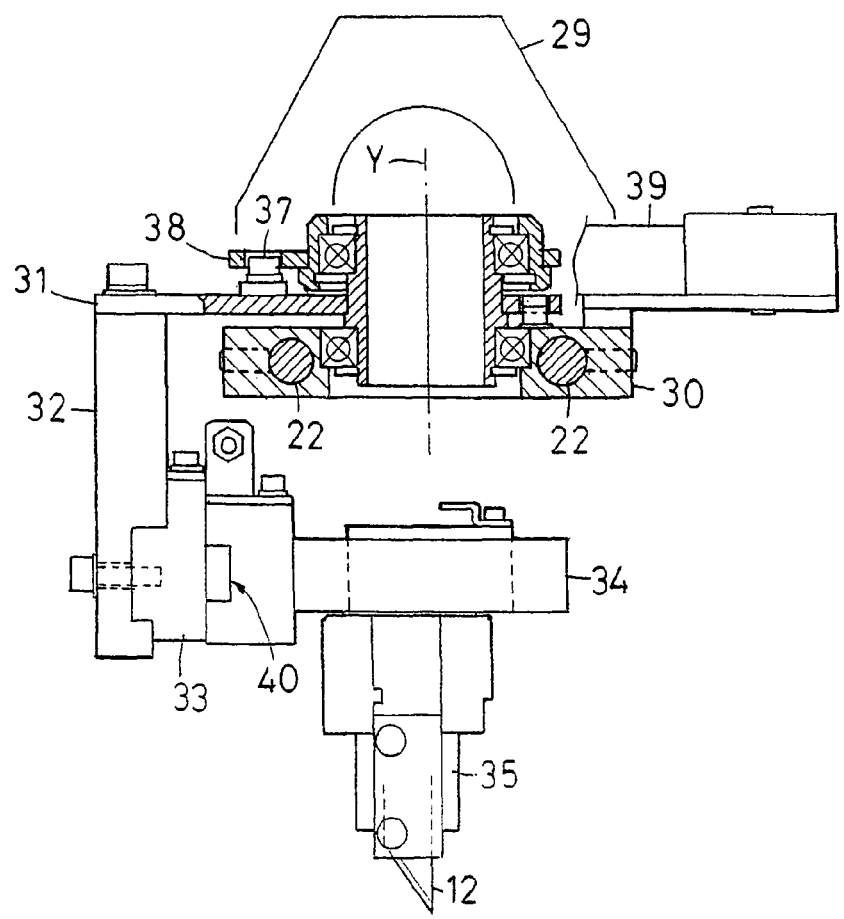
FIG. 5 is a vertical sectional front view of a part of a cutter unit.

As illustrated in FIG. 3 and FIG. 5, a bracket 30 fixes to the free end part of the support arm 22, and the cutter unit 23 is equipped and supported to the bracket 30. The cutter unit 23 includes: a rotating member 31 rotatably supported within a fixed region around a vertical supporting axis Y in the bracket 30; a vertical wall-like supporting bracket 32 linked to the underside of the end part of the rotating member 31; a cutter supporting component 33 fixed to the side face of the supporting bracket 32; a bracket 34 supported by the cutter support component 33; and a cutter holder 35 attached to the bracket 34 etc. The cutter blade 12 is interchangeably fixed to the side face of the cutter holder 35 with a screw.

Figure 4:
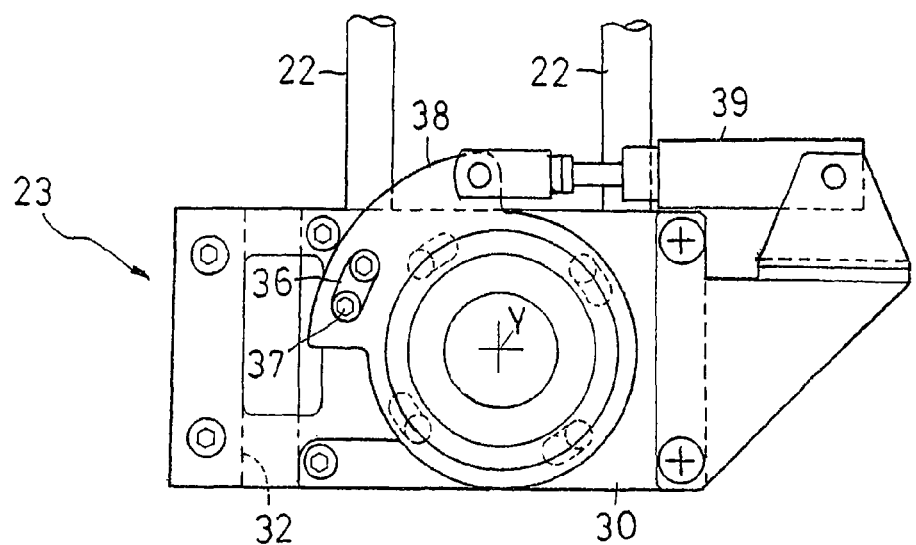
FIG. 4 is a plan view of a cutter unit.

Here, as illustrated in FIG. 4, there is disposed an operation flange 38 that rotates integrally with the rotating member 31 by engaging between a long hole 36 and a projection 37 on the upper part of the rotating member 31. The air cylinder 39 rotates the operation flange 38. This action changes the position of the whole cutter unit 23 with respect to the support arm 22 around the vertical supporting axis Y, allowing adjustment of the angle of the cutter blade 12 in a traveling direction within a predetermined region.

The bracket 34 is slidably supported in a straight line through a guiding rail mechanism 40 in a longitudinal direction of the support arm 22 (in a vertical direction to the paper in FIG. 5) with respect to the cutter support component 33. Furthermore, as illustrated in FIG. 2, a spring 42 is stretched from the cutter support component 33 to the bracket 34. The elastic restoring force of the spring 42 slidably biases the bracket 34 in a direction approaching to the vertical axis center (center line of rotation) X. Here, the spring 42 is equivalent to the pushing biasing device of the present invention.

Figure 7:
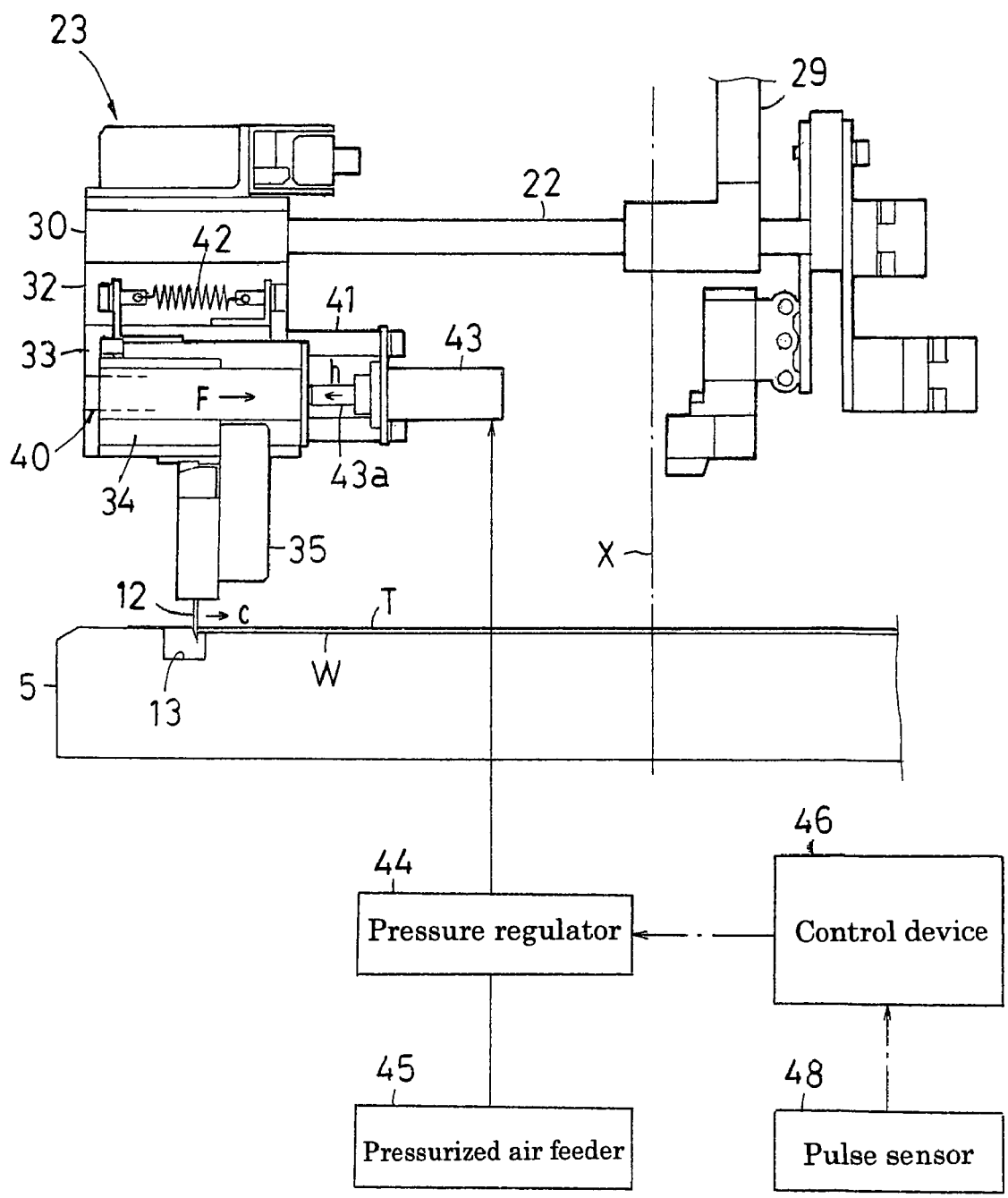
FIG. 7 is a side elevational view illustrating a principal part when a cutter blade is set to a starting position of cutting.

As illustrated in FIG. 6 and FIG. 7, an air cylinder 43 having a position along the sliding direction of the bracket 34 is fixed through a stay 41 in the center side of the rotation of the cutter support component 33. A piston rod 43a of the air cylinder 43 is contactably disposed to the end face of the bracket 34. Here, the air cylinder 43 is equivalent to the pushing back device of the present invention.

The air cylinder 43 is connected to a pressurized air feeder 45 through a pressure regulator 44 in an electrical control type, and simultaneously the pressure regulator 44 is connected to a control device 46. Furthermore, as illustrated in FIG. 2, a disc 47 having notches or penetration holes formed on the outer peripheral part in an even pitch is fixed on the upper part of the rotating shaft 26, and simultaneously an electromagnetic or photoelectric pulse sensor 48 is disposed facing to the outer peripheral part of this disc 47. That is, a pulse corresponding to the rotation of the disc 47 is outputted from the pulse sensor 48. A detection signal from the pulse sensor 48 is inputted into the control device 46, and the traveling speed of the cutter blade 12 is calculated based on a period of the pulse. Here, the control device 46 is equivalent to the control device of the present invention.

Hereinafter, a series of elementary action will be described with reference to FIGS. 6 to 9, using apparatuses for applying a protective tape T on the surface of a wafer W of the above-described embodiments. When a command for application is issued, firstly the robot arm 2 in the wafer transport mechanism 3 moves to the cassette C that has been mounted in the cassette base 12. The wafer holding section 2a is inserted in a clearance between wafers included in the cassette C, and the wafer holding section 2a holds one wafer W with suction from the back side (underside) and takes the wafer out. The robot arm 2 transports the taken-out wafer W to the alignment stage 4.

The position of the wafer W mounted in the alignment stage 4 is adjusted using a notch and an orientation flat formed in the periphery of the wafer W. The wafer W after position adjustment is again taken out by the robot arm 2, and is mounted in the chuck table 5.

Figure 8:
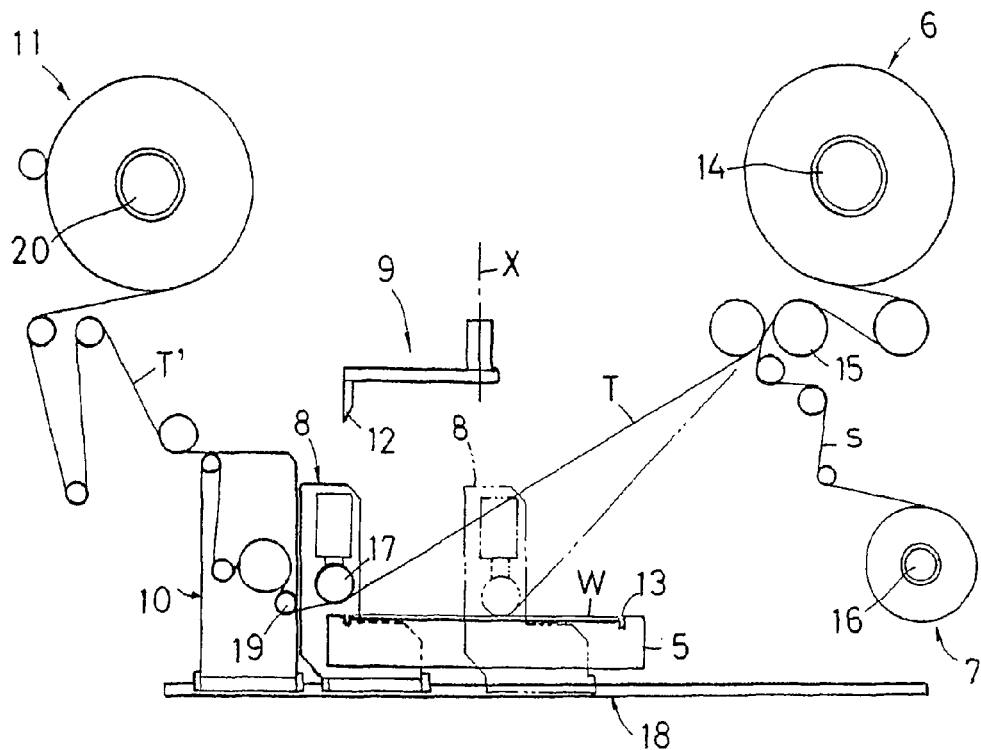
FIG. 8 is a front view illustrating a process of applying a protective tape.

The wafer W mounted on the chuck table 5 is suction-held with position adjustment for giving the center thereof coincident with the center of the chuck table 5. As illustrated in FIG. 8 at this time, the application unit 8 and the separating unit 10 are in the initial position in the left-hand side. The cutter blade 12 of the tape cutting mechanism 9 is in a waiting state in the upper initial position.

Next, as illustrated with an imaginary line in FIG. 8, the application roller 17 of the application unit 8 descends, and simultaneously while pressing the protective tape T downward with this application roller 17, rolls ahead (right in FIG. 8) on the wafer W. The protective tape T is applied on the whole surface of the wafer W with this rolling motion.

Figure 9:
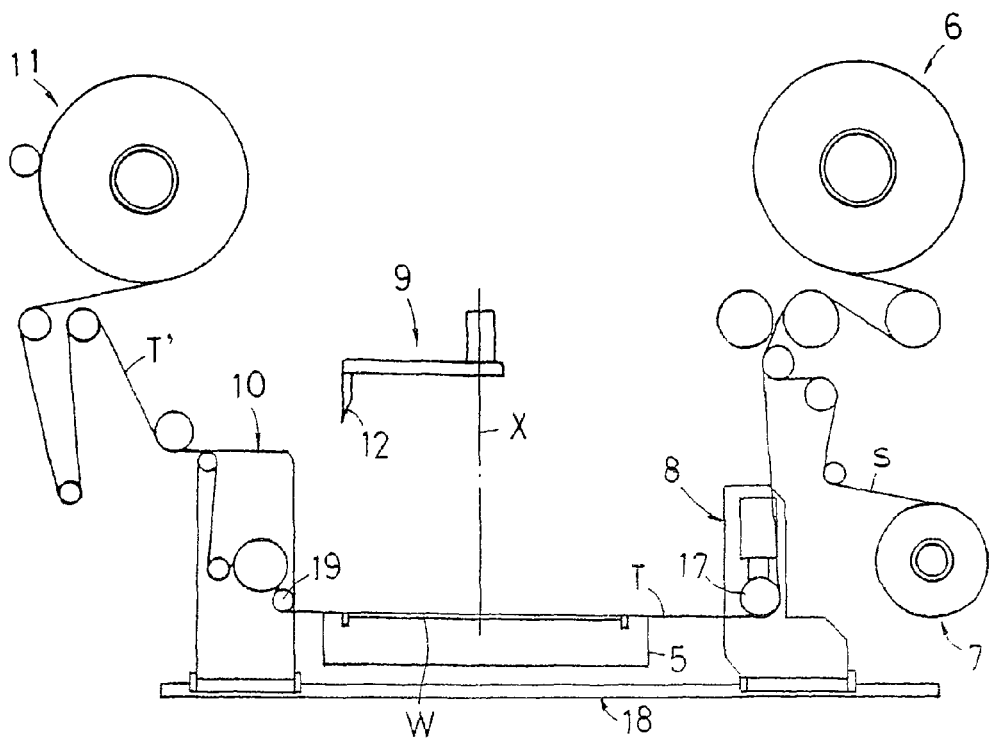
FIG. 9 is a front view illustrating a process of applying a protective tape.

As illustrated in FIG. 9, when the application unit 8 arrives at the end position, the cutter blade 12 that has been standing ready above will descend. In a part of the cutter traveling groove 13 of the chuck table 5, the cutter blade 12 is stuck into the protective tape T.

In this case, as illustrated in FIG. 6, air having a high pressure has been supplied to the air cylinder 43 to greatly project the piston rod 43a, and the bracket 34 has been slid to the stroke end outside against the spring 42. The cutter blade 12 is then stuck a little (several millimeters) into the protective tape T in a position distant outside from the outer circumferential edge of the wafer W. Then, the air pressure of the air cylinder 43 is reduced so that the projection force of the piston rod 43a may give a smaller force than the spring force, and as illustrated in FIG. 7, the bracket 34 is slid with the pushing biasing force of the spring 42. As a result, the cutter blade 12 is contacted to the periphery of the wafer W.

Figure 10:
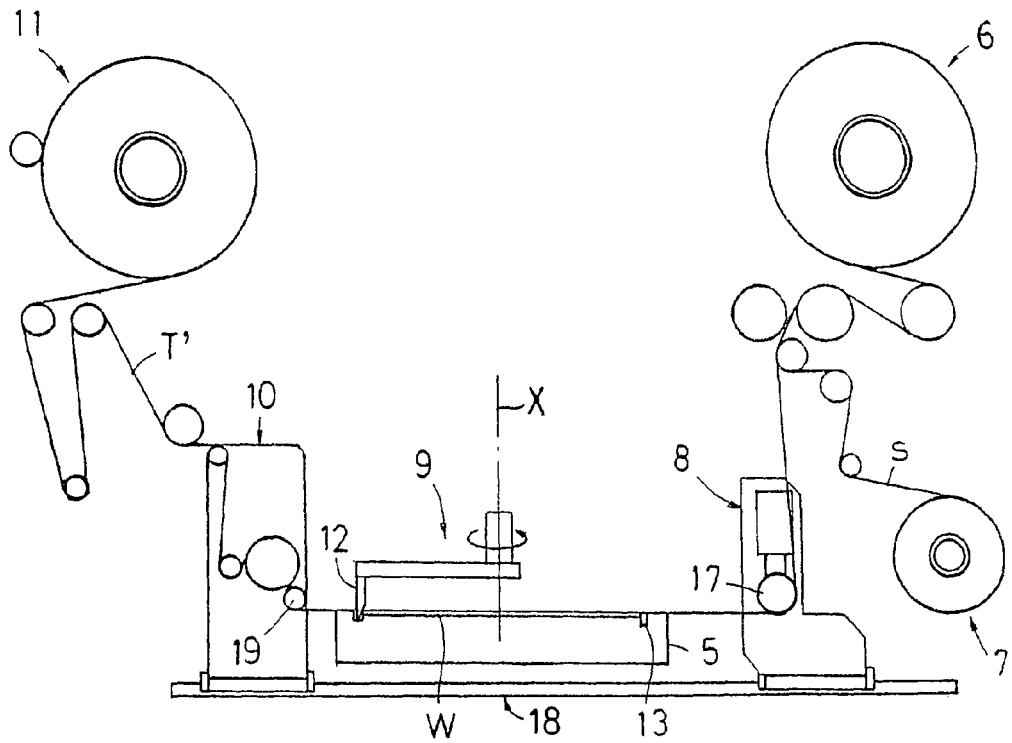
FIG. 10 is a front view illustrating a process of applying a protective tape.

In the starting position of cutting of the cutter blade 12, as illustrated in FIG. 10, the support arm 22 rotates in a predetermined direction after end of setting of the cutter blade 12 of pushing to the outer circumferential edge of the wafer. This revolution rotates the cutter blade 12 around the vertical axis center X as the center of rotation to cut the protective tape T along with the outer circumferential edge of the wafer.

Figure 11:
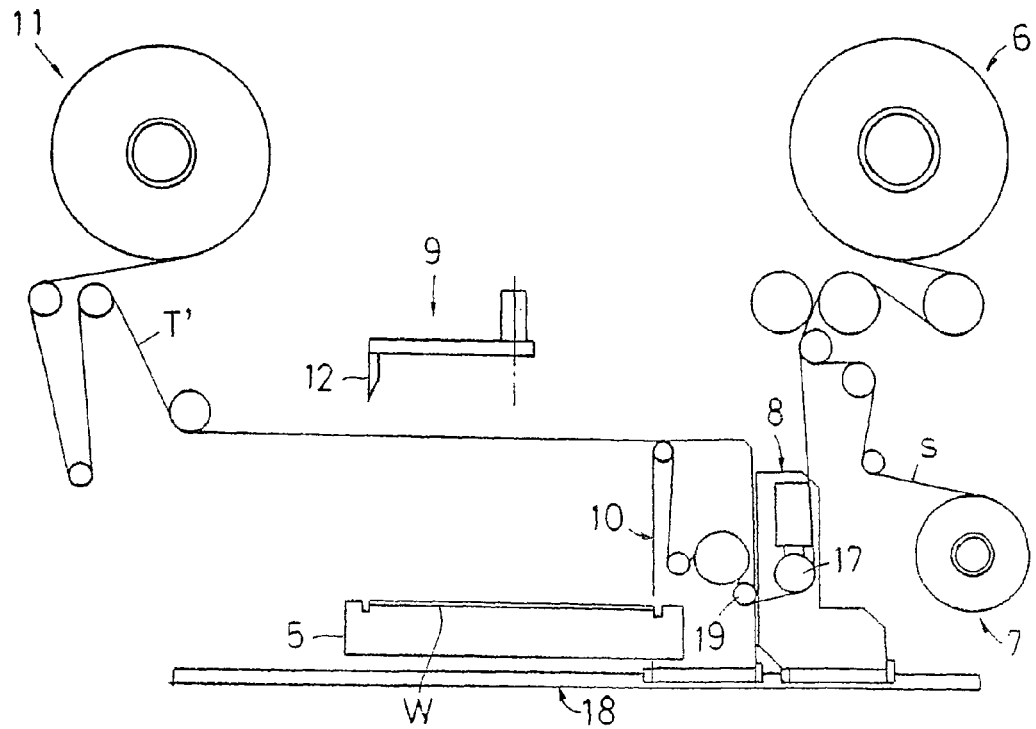
FIG. 11 is a front view illustrating a process of applying a protective tape.

After end of the cut of the tape along with the outer circumferential edge of the wafer, as illustrated in FIG. 11, the cutter blade 12 ascends to an upper waiting position, and simultaneously, while the separating unit 10 moves forward, it separates the unnecessary tape T' after cut and remained on the wafer W by winding.

When the separating unit 10 arrives at the end position of separating operation, the separating unit 10 and the application unit 8 move in an opposite direction to return to the initial position. While the unnecessary tape T' is taken up by the collecting bobbin 20 at this time, a fixed amount of the protective tape T is delivered out from the tape feed section 6.

When the tape applying operation is completed, the sucking in the chuck table 5 is canceled, subsequently the wafer W after applying process is transported to the wafer holding section 2a of the robot arm 2, and then inserted into the cassette C of the wafer feeding/collecting section 1 for collection.

In this manner, one cycle of the tape applying process is completed. After that, the above-described operation will sequentially be repeated.

In the above-described process of tape cutting, the pressure regulator 44 is automatically adjusted corresponding to the variation of the traveling speed of the cutter blade 12 that has been calculated based on the detected signal from the pulse sensor 48, and the air pressure of the air cylinder 43 is controlled in the following manner.

Figure 12:
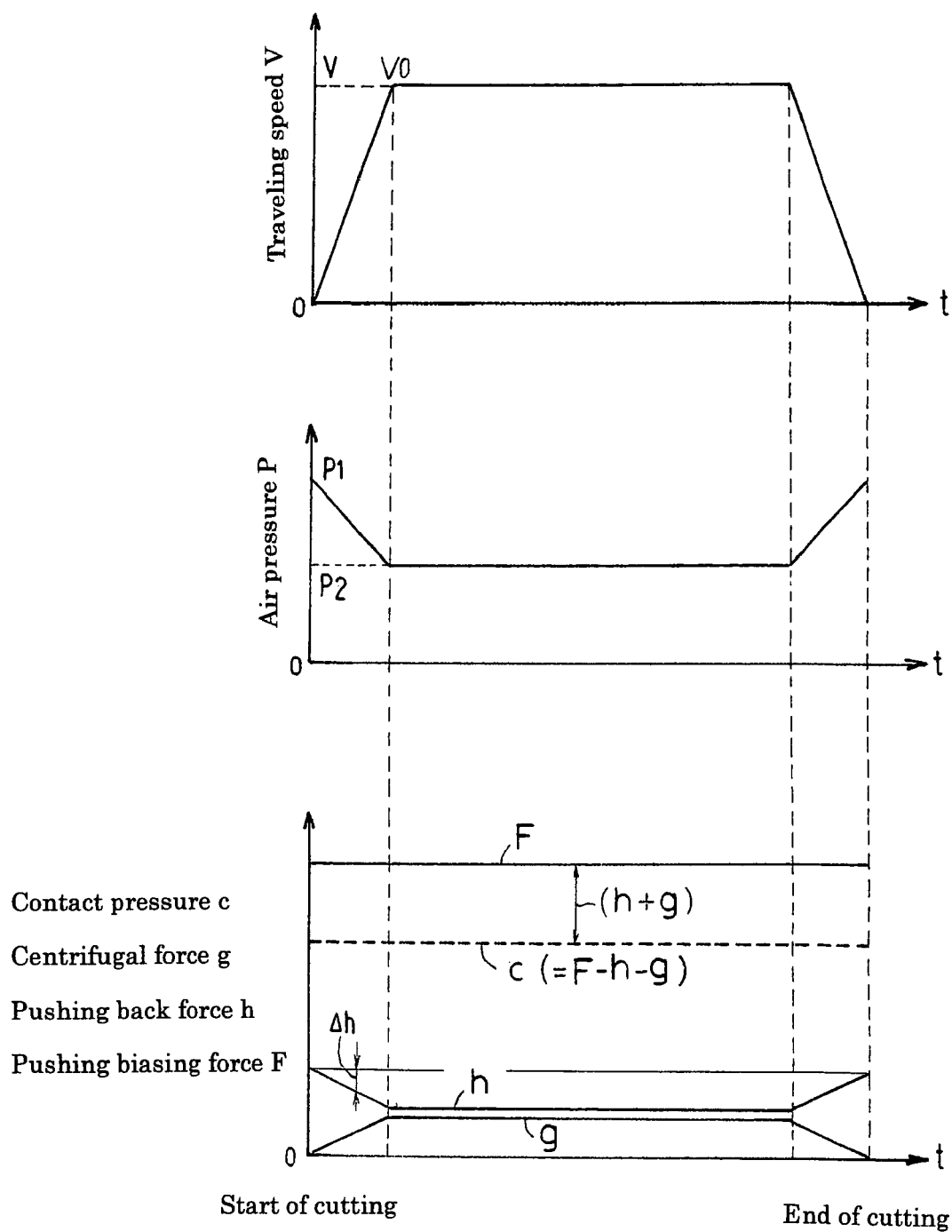
FIG. 12 is a diagram illustrating a property of variation of a traveling speed of a cutter blade, an air pressure of an air cylinder, a pushing biasing force with a spring, a pushing back force, a centrifugal force, and a contact pressure of a cutter blade.

FIG. 12 illustrates the variation of the traveling speed V of the cutter blade 12 caused by the progress of time, the air pressure P supplied to the air cylinder 43, the pushing biasing force F with the spring 42, the pushing back force h given to the cutter blade 12 by the air cylinder 43, the centrifugal force g acting to the cutter blade 12, and the contact pressure c to the outer circumferential edge of a wafer of the cutter blade 12 from the start of cutting to the end of cutting.

At the time when the cutter blade 12 is set to the starting position of cutting and is halted, a predetermined air pressure P1 is being supplied to the air cylinder 43, and a predetermined pushing back force h smaller than the pushing biasing force F given with the spring 42 is applied to the bracket 34 by the piston rod 43a. Therefore, the contact pressure c to the periphery of the wafer of the cutter blade 12 at this time, will be a value obtained by subtraction of the pushing back force h with the air cylinder 43 from a fixed pushing biasing force F with the spring 42 (c=F−h).

When the rotating travel of the cutter blade 12 is started, the traveling speed V rises (accelerates), and this acceleration generates a centrifugal force g. Thereby the contact pressure c to the outer circumferential edge of the wafer of the cutter blade 12 during the rotating travel will give a magnitude obtained by subtraction of the pushing back force h and the centrifugal force g from the pushing biasing force F (c=F−f−g). Here, the air pressure P supplied to the air cylinder 43 drops with the rise of the traveling speed V of the cutter blade 12, and the pushing back force h with the piston rod 43a becomes gradually smaller. The decrease amount delta h of this pushing back force h is beforehand inputted and set up so as to give a magnitude equivalent to the centrifugal force g generated by the rotating travel of the cutter blade 12. For example, the control of the air pressure P based on a mapped data etc. maintains the contact pressure c to the outer circumferential edge of the wafer of the cutter blade 12 to the magnitude at the start point of time of the traveling. After the traveling speed V reaches the normal speed V0 that has been set up beforehand, the cutter 12 will travel at a fixed speed of this normal speed V0. Maintenance of the traveling speed V at the normal speed V0 keeps constant the centrifugal force g to be generated. Correspondingly, the air pressure P of the air cylinder 43 is maintained at a lower specified value P2, and thereby the pushing back force h with the piston rod 43a is maintained at a fixed value. That is, the contact pressure c to the outer circumferential edge of the wafer of the cutter blade 12 is maintained at the start point of time of the traveling.

When the traveling for cut approaches the end, the traveling speed V of the cutter blade 12 drops (deceleration) accompanied by the fall of the centrifugal force g, the air pressure P of the air cylinder 43 is controlled to rise corresponding to this deceleration, and the pushing back force h from the piston rod 43a will be gradually larger. That is, the contact pressure c to the outer circumferential edge of the wafer of the cutter blade 12 is maintained at a magnitude at the start point of time of the traveling.

As described above, corresponding to the variation of the traveling speed in rotating travel of the cutter blade 12, control of the pushing back force h enables stable maintenance of the contact pressure c to the outer circumferential edge of the wafer of the cutter blade 12 to a magnitude set at the start point of time of the traveling all over the peripheries of the wafer. Therefore, cutting of the protective tape with excellent finish will be performed all over the peripheries of the wafer. Since agreement between the starting position and end position of cutting may be provided, failure in cutting of the protective tape T, and breakage in separating of the protective tape T caused by failure of the cutting etc. may be cancelled.

The present invention may also be carried out with following configurations.

(1) In the above-described embodiment, although control of the air pressure of the air cylinder 43 is performed by actual measurement of the speed variation of the cutter blade 12, following configuration is also employable. In rotating travel of the cutter blade 12, in the case where the time characteristics of the speed variation of acceleration from the halting state to the normal speed, and the time characteristics of the speed variation of deceleration from the normal speed until halt are set up beforehand, the speed variation is indirectly calculated based on the detection of the time progress from the starting position of cutting of the cutter blade 12, or based on the detection of the traveling amount from a point of time of traveling start of the cutter blade 12. Control of the air pressure of the air cylinder 43 based on this variation information can also exhibit equivalent function.

(2) The variation of the traveling speed of the cutter blade 12 is directly detected by providing an acceleration sensor in a suitable location of the cutter-unit 23. Control of the air pressure of the air cylinder 43 can also be performed based on this detected information.

Figure 13:
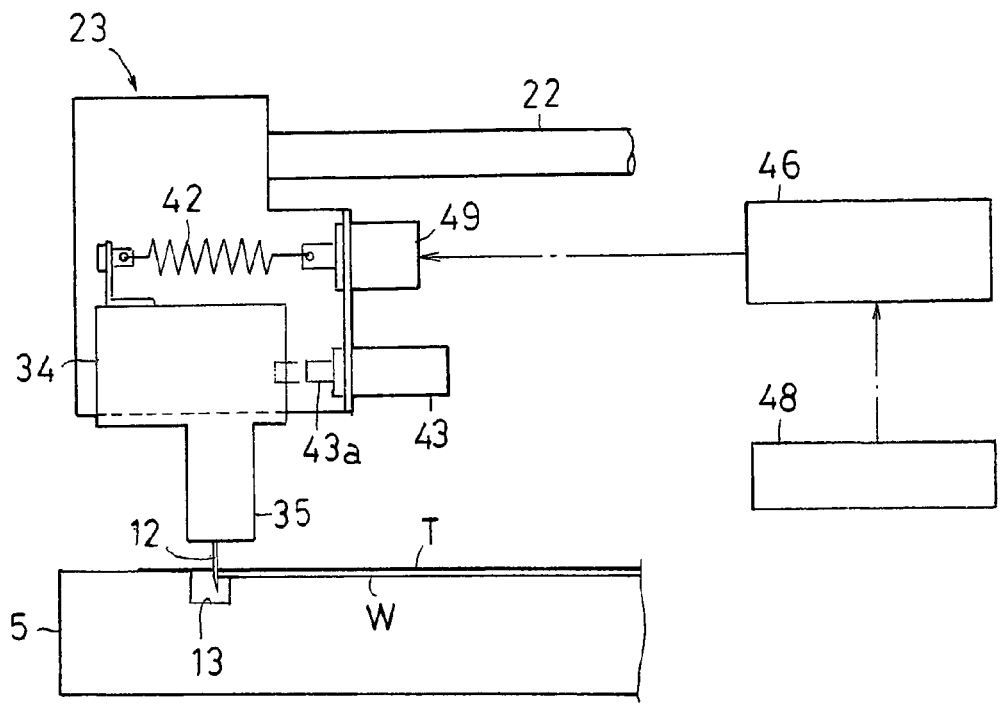
FIG. 13 is a principle figure illustrating another embodiment.

(3) In the present invention, the stable contact pressure c can also be obtained by control of the pushing biasing force F with the spring 42 itself. For example, as illustrated in the principle figure of FIG. 13, the air cylinder 43 is used only for moving the cutter blade 12 to an entry position and the starting position of cutting of the tape, and the fixed end of the spring 42 is linked with an electric actuators 49, such as an electromagnetic solenoid and an electric motor. Subsequently, responding to the variation of the traveling speed calculated based on the detection information of the pulse sensor 48, the actuation of the electric actuator 49 is controlled to perform automatic position adjustment of the fixed end of the spring 42. That is, the tension of the spring 42 is controlled based on the speed variation of the cutter blade 12 so that the centrifugal force g generated by traveling and acted to the cutter blade 12 may be compensated. This configuration allows stable maintenance of the contact pressure c of the cutter blade 12 to the outer circumferential edge of the wafer in all the peripheries.

Figure 14:
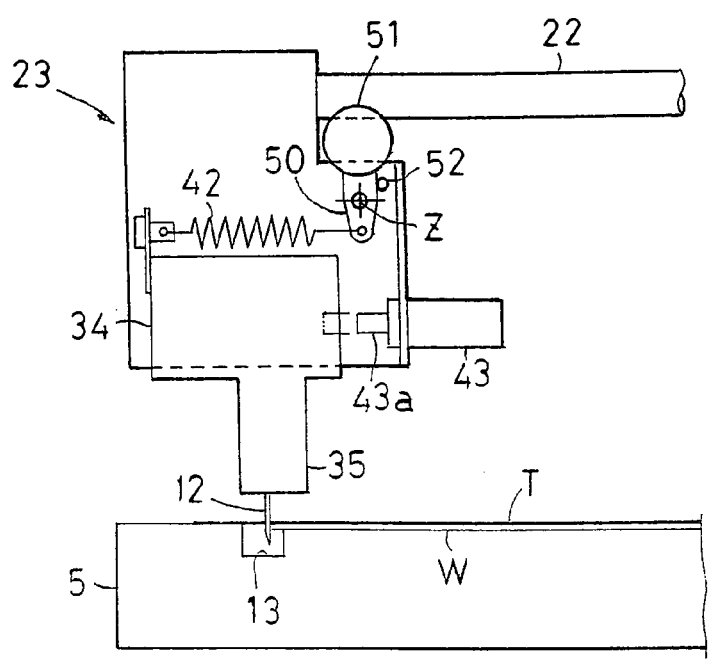
FIG. 14 is a principle figure illustrating another embodiment.

(4) In the apparatus of the present invention, the pushing biasing force F with the spring 42 itself can also be automatically and mechanically controlled corresponding to the traveling speed variation without use of the control device 46 etc. For example, as illustrated in the principle figure of FIG. 14, an operating arm 50 freely swingable around the supporting point Z that is parallel to the traveling direction of the cutter is provided to the fixed part in the cutter unit 23. Furthermore, the fixed end of the spring 42 for pushing bias is connected to the bottom end of this operating arm 50, and at the same time the upper part of the operating arm 50 is equipped with the balance weight 51.

In this configuration, in the condition that the cutter blade 12 is halted, the operating arm 50 for receiving the tension by the spring 42 is caught by the stopper 52 to be maintained at a predetermined position, and thus the pushing biasing force with the spring 42 is set at a predetermined magnitude. In start of rotating travel of the cutter blade 12, the operating arm 50 is swung with the centrifugal force acted to the balance weight 51, leading to increase of the tension of the spring 42. Corresponding to this action, a pushing biasing force is added by an amount of reduction of the pushing biasing force based on the centrifugal force acted on the cutter blade 12, allowing stable maintenance of the contact pressure c of the cutter blade 12 to the outer circumferential edge of the wafer all over the peripheries.

The present invention may be embodied in other specific forms without departing from the spirit or essential attributes thereof and, accordingly, reference should be made to the appended claims, rather than to the foregoing specification, as indicating the scope of the invention.

What is claimed is:

1. An apparatus for cutting a protective tape of a semiconductor wafer for cutting a protective tape applied on a surface of the semiconductor wafer along a contour of the wafer by rotating and traveling a cutter blade along an outer circumferential edge of the semiconductor wafer, the apparatus comprising:
   a pushing biasing device configured to apply a biasing force by pushing the cutter blade to the outer circumferential edge of the semiconductor wafer with an elastic restoring force of a spring so as to apply a constant pushing biasing force facing to the outer circumferential edge of the semiconductor wafer during the rotating and traveling of the cutter blade, the cutter blade movably supported in a radial direction of the wafer;
   a pushing-hack device for applying a pushing back force smaller than the pushing biasing force in a direction opposite to the pushing bias direction with respect to the cutter blade when the cutter blade travels along the outer circumferential edge of the semiconductor wafer; and
   a controlling device for automatically controlling the pushing back force applied by the pushing back device corresponding to a variation of a traveling speed of the cutter blade such that the controlling device detects an amount of traveling from the start point of time of traveling of the cutter blade, calculates the variation of the speed based on a detection result, and controls the air pressure of the air cylinder based on an information on an obtained variation.

2. An apparatus for cutting a protective tape of a semiconductor wafer for cutting a protective tape applied on a surface of the semiconductor wafer along a contour of the wafer by rotating and traveling a cutter blade along an outer circumferential edge of the semiconductor wafer, the apparatus comprising:
   a pushing biasing device configured to apply a biasing force by pushing the cutter blade to the outer circumferential edge of the semiconductor wafer with an elastic restoring force of a spring so as to apply a constant pushing biasing force facing to the outer circumferential edge of the semiconductor wafer during the rotating and traveling of the cutter blade, the cutter blade movably supported in a radial direction of the wafer;
   a pushing-back device for moving the cutter blade to an entry and starting position on the protective tape;
   a controlling device for automatically controlling the constant biasing force based on a variation of a traveling speed of the cutter blade;
   an actuator linked with a first end of the spring; and
   a sensor for detecting the traveling speed of the cutter blade;
   wherein the control device controls operation of the actuator based on the traveling speed of the cutter blade detected by the sensor; and
   wherein the actuator displaces the first end of the spring to maintain the constant biasing force on the circumferential edge of the semiconductor wafer.

* * * * *